(12) United States Patent
Seller

(10) Patent No.: US 8,774,298 B2
(45) Date of Patent: Jul. 8, 2014

(54) TRANSMITTER WITH ADAPTIVE BACK-OFF

(75) Inventor: Olivier Seller, Auribeau sur Siagne (FR)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/454,037

(22) Filed: Apr. 23, 2012

(65) Prior Publication Data

US 2013/0279629 A1 Oct. 24, 2013

(51) Int. Cl.
*H04K 1/10* (2006.01)
*H04L 27/28* (2006.01)

(52) U.S. Cl.
USPC .......................................... 375/260; 375/259

(58) Field of Classification Search
USPC ................................. 375/260, 259
See application file for complete search history.

(56) References Cited

U.S. PATENT DOCUMENTS

| 6,535,066 | B1 | 3/2003 | Petsko | |
|---|---|---|---|---|
| 2005/0242875 | A1 | 11/2005 | Gurvich et al. | |
| 2006/0178121 | A1* | 8/2006 | Hamalainen et al. | 455/125 |
| 2009/0232194 | A1 | 9/2009 | Yoshida | |
| 2011/0116569 | A1* | 5/2011 | Vaughan et al. | 375/295 |
| 2012/0120990 | A1* | 5/2012 | Koren et al. | 375/219 |

FOREIGN PATENT DOCUMENTS

| WO | 2004077664 A1 | 9/2004 |
|---|---|---|
| WO | 2005004325 A1 | 1/2005 |

OTHER PUBLICATIONS

Search Report for UK Application No. GB1301813.0, dated Jul. 27, 2013.

* cited by examiner

*Primary Examiner* — Chieh M Fan
*Assistant Examiner* — Brian J Stevens
(74) *Attorney, Agent, or Firm* — John W. Branch; Lowe Graham Jones PLLC

(57) ABSTRACT

A transmitter for transmitting data symbols using an orthogonal frequency division multiplexing (OFDM) scheme, the transmitter comprising: a modulator for generating a plurality of mutually orthogonal sub-carriers, each of the plurality of sub-carriers being modulated with a stream of data symbols to be transmitted; an amplifier for amplifying a signal containing the plurality of modulated sub-carriers for transmission of the signal; and a symbol processor for processing the data symbols of the plurality of sub-carriers, the symbol processor being configured to compute a plurality of EVM values for each data symbol to be transmitted, each of the plurality of EVM values being computed based on a different one of a plurality of candidate back-off values for the amplifier, and to select one of the plurality of candidate back-off values to apply to the transmitter for the data symbol based on the computed EVM values.

12 Claims, 1 Drawing Sheet

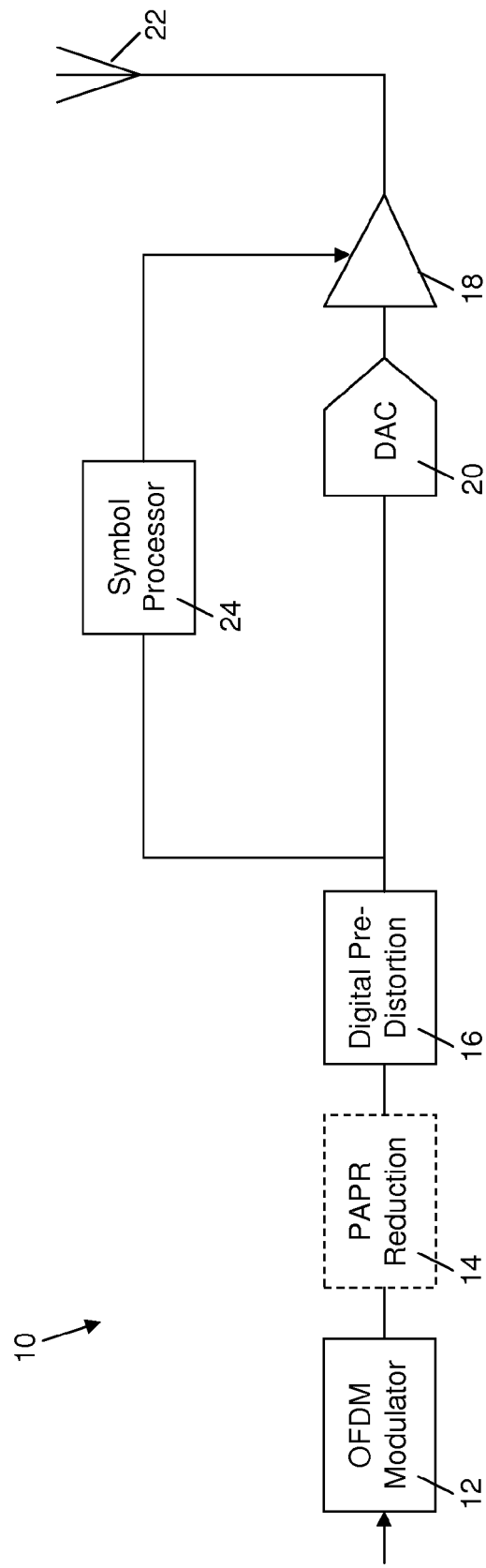

TRANSMITTER WITH ADAPTIVE BACK-OFF

TECHNICAL FIELD

The present application relates to a transmitter for transmitting data symbols using an orthogonal frequency division multiplexing (OFDM) scheme, and to a method for transmitting data symbols using an orthogonal frequency division multiplexing (OFDM) scheme.

BACKGROUND TO THE INVENTION

Orthogonal frequency division multiplexing (OFDM) is a popular scheme for wideband digital communications. In OFDM transmission schemes a stream of data symbols to be transmitted is divided into a plurality of sub-streams, and each of these sub-streams is modulated onto one of a plurality of mutually orthogonal sub-carriers within the available transmission bandwidth using a modulation scheme such as quadrature amplitude modulation (QAM), quadrature phase shift keying (QSK) or binary phase shift keying (BPSK). The plurality of modulated sub-carriers are linearly summed to generate the signal to be transmitted.

Whilst OFDM schemes offer benefits such as improved spectral efficiency and reduced susceptibility to inter-symbol interference, they suffer from the disadvantage of a high peak to average power ratio (PAPR). In order to minimise distortion and other negative effects associated with amplifier non-linearities, it is important that a power amplifier in an OFDM transmitter operates in its linear region as much as possible. However, as the peak power of the OFDM signal to be transmitted may be significantly higher than its average power, due to differences in the power of individual data symbols in the signal to be transmitted, the amplifier must be configured such that it will operate in its linear region for the full range of input symbol powers, i.e. at both the average symbol power and the peak symbol power. This implies configuring the amplifier with a significant back-off, i.e. the output signal power of the amplifier for an input symbol of average power is significantly lower than the maximum output power of the amplifier, so that if an input symbol of peak power is received the amplifier still operates in its linear range and is thus able to amplify the input symbol without introducing distortion in the amplified output signal.

This back-off may be as much as 10 dB, which means that for an amplifier that is capable of an output power of 1 Watt, the useful power output is only 100 milliwatts. This significantly impairs the power efficiency of the OFDM transmitter.

In practice, the choice of back-off is typically a compromise between amplifier efficiency and amplifier linearity, and typically an amplified symbol output by a power amplifier in an OFDM transmitter will be clipped due to the non-linearity of the amplifier. This clipping of the output signal gives rise to spectral regrowth and transmit errors. This is because the clipping reduces the amplitude of symbols to be transmitted, causing their actual position (in a polar symbol space) to differ from the expected position of the symbol in the polar symbol space. Spectral regrowth occurs when the actual position of a symbol in the polar symbol space due to clipping results in the energy of the symbol appearing outside of the transmit bandwidth of the signal, whilst transmit errors occur when the energy of the symbol appears in the transmit bandwidth of the signal. The error vector magnitude (EVM) of a transmitted symbol is the magnitude of the difference between its actual position (in a polar symbol space) and its expected position.

Higher order modulation schemes require very low EVM values. For example, for good operation of the 256QAM, R=5/6 modulation and coding scheme (which is known as MCS9) used in the IEEE802.11ac standard, the total EVM should be no greater than −36 dB in average white Gaussian noise (AWGN) channel conditions. This −36 dB figure is the total EVM budget, and so the transmit errors resulting from clipping should be lower, as there are other sources of EVM such as phase noise in a local oscillator of the transmitter.

SUMMARY OF INVENTION

According to a first aspect of the invention there is provided transmitter for transmitting data symbols using an orthogonal frequency division multiplexing (OFDM) scheme, the transmitter comprising: a modulator for generating a plurality of mutually orthogonal sub-carriers, each of the plurality of sub-carriers being modulated with a stream of data symbols to be transmitted; an amplifier for amplifying a signal containing the plurality of modulated sub-carriers for transmission of the signal; and a symbol processor for processing the data symbols of the plurality of sub-carriers, the symbol processor being configured to compute a plurality of EVM values for each data symbol to be transmitted, each of the plurality of EVM values being computed based on a different one of a plurality of candidate back-off values for the amplifier, and to select one of the plurality of candidate back-off values to apply to the transmitter for the data symbol based on the computed EVM values.

The symbol processor may be configured to compute a signal to noise ratio (SNR) at a receiver for each of the plurality of candidate back-off values using the EVM value computed for each of the plurality of candidate back-off values, and to select the candidate back-off value that produces the highest SNR.

The symbol processor may be configured to select one of the plurality of candidate back-off values for which the computed EVM value meets a constant target EVM value that must be achieved by all of the transmitted symbols.

The constant target EVM value may be based on a minimum required SNR that must be achieved at a receiver to permit good reception of the transmitted symbol.

The constant target EVM value may be dependent upon the data rate of the transmitted symbol.

The selected candidate back-off level may applied by dividing each sample of the symbol to be transmitted by the selected candidate back-off level.

Alternatively, the selected candidate back-off level may be applied by adjusting a supply voltage of the power amplifier.

In this case, the supply voltage of the power amplifier may be adjusted during a guard interval of the symbol to be transmitted.

The transmitter may further comprise a peak to average power ratio (PAPR) reduction unit configured to receive a signal containing the plurality of modulated sub-carriers and to process the received signal to reduce its PAPR.

The transmitter may further comprise a pre-distorter configured to receive a signal containing the plurality of modulated sub-carriers and to apply distortion to the received signal to compensate for distortion that will be introduced to the received signal by the amplifier.

According to a second aspect of the invention there is provided a method for transmitting data symbols using an orthogonal frequency division multiplexing (OFDM) scheme, the method comprising: generating a plurality of mutually orthogonal sub-carriers, each of the plurality of sub-carriers being modulated with a stream of data symbols to be transmitted; using an amplifier to amplify a signal containing the plurality of modulated sub-carriers for transmission of the signal; and processing the data symbols of the plurality of sub-carriers, wherein processing the data symbols comprises computing a plurality of EVM values for each data symbol to be transmitted, each of the plurality of EVM values being computed based on a different one of a plurality of candidate back-off values for the amplifier, and selecting one of the plurality of candidate back-off values to apply for the data symbol based on the computed EVM values.

Processing the data symbols may further comprise computing a signal to noise ratio (SNR) at a receiver for each of the plurality of candidate back-off values using the EVM value computed for each of the plurality of candidate back-off values, and selecting the candidate back-off value that produces the highest SNR.

The method may further comprise selecting one of the plurality of candidate back-off values for which the computed EVM value meets a constant target EVM value that must be achieved by all of the transmitted symbols The constant target EVM value may be based on a minimum required SNR that must be achieved at a receiver to permit good reception of the transmitted symbol.

The constant target EVM value may be dependent upon the data rate of the transmitted symbol.

The selected candidate back-off level may applied by dividing each sample of the symbol to be transmitted by the selected candidate back-off level.

Alternatively, the selected candidate back-off level may be applied by adjusting a supply voltage of the power amplifier.

In this case, the supply voltage of the power amplifier may be adjusted during a guard interval of the symbol to be transmitted.

The method may further comprise receive a signal containing the plurality of modulated sub-carriers and processing the received signal to reduce its PAPR.

The method may further comprise receiving a signal containing the plurality of modulated sub-carriers and applying distortion to the received signal to compensate for distortion that will be introduced to the received signal by the amplifier.

BRIEF DESCRIPTION OF THE DRAWINGS

Embodiments of the invention will now be described, strictly by way of example only, with reference to the accompanying drawing, FIG. 1, which is a schematic representation of a transmitter for transmitting data symbols using an orthogonal frequency division multiplexing (OFDM) scheme.

DESCRIPTION OF THE EMBODIMENTS

An OFDM transmitter is shown generally at 10 in the schematic block diagram of FIG. 1. It is to be understood that the schematic representation of FIG. 1 shows functional blocks of an OFDM transmitter, which are not necessarily representative of physical components of the system, but are used only for the purpose of describing the operation of the OFDM transmitter 10. Additionally, only those functional blocks that are required to understand the present invention are shown in FIG. 1; a practical implementation of an OFDM transmitter may include additional functional blocks.

The OFDM transmitter 10 includes an OFDM modulator 12, which is configured to receive a serial stream of digital data symbols to be transmitted. This serial stream of data symbols is divided into a plurality of parallel streams of data symbols, and the plurality of parallel data streams are modulated onto a plurality of sub-carriers using a modulation scheme such as quadrature amplitude modulation (QAM), quadrature phase shift keying (QSK) or binary phase shift keying (BPSK). The plurality of digitally modulated sub-carriers are then linearly summed to generate a single composite signal containing all of the digitally modulated sub-carriers.

In some embodiments, the composite signal containing all of the digitally modulated sub-carriers is passed to a peak to average power ratio (PAPR) reduction unit 14, which is configured to process the composite signal to reduce its PAPR. However, it will be appreciated that this step is not essential.

The composite signal (whether processed by the PAPR reduction unit 14 or not) is passed to a digital pre-distorter 16, which is operative to perform a pre-distortion operation on the composite signal, to compensate at least partially for distortion that will be introduced to the composite signal during amplification by a power amplifier 18 of the transmitter 10. Again, this pre-distortion step is not essential.

From the digital pre-distorter 16, the composite signal is input to a digital to analogue converter (DAC) 20, which converts the composite signal into an analogue signal that can be amplified by the power amplifier 18 to produce an amplified signal that is transmitted via an antenna 22.

The composite signal output by the digital pre-distorter 16 is also passed to a symbol processor 24, which is configured to compute an EVM value for each OFDM symbol of the composite signal at a plurality of different candidate back-off levels of the power amplifier 18, and to select a back-off level of the power amplifier 18 for each OFDM symbol such that the optimum back-off level is selected for each OFDM symbol to maximise the power efficiency of the power amplifier 18 on a per-symbol basis. The result of this dynamic adjustment of the back-off level of the power amplifier 18 on a per symbol basis (i.e. adaptive power amplifier back-off) is that either the average power per symbol is no longer constant, or the configuration of the power amplifier 18 is not constant for all transmitted symbols.

The symbol processor 24 is configured to select the back-off level of the power amplifier 18 from a plurality of different candidate back-off level values. The selection of the back-off level may be based on one of two criteria: a constant EVM for all symbols; or maximum SNR for each symbol.

Where the back-off level is selected to achieve a constant EVM for all symbols, a constant target EVM value for each of the symbols to be transmitted is selected. This constant target EVM value is an EVM value that must be achieved for all of the symbols transmitted. The selection of the constant target EVM value may be based on a minimum required SNR of the transmitted symbol at a receiver to permit good reception of the transmitted symbol at a receiver operating close to sensitivity (i.e. a receiver operating such that a signal received with the minimum required SNR of the transmitted signal will produce a minimum SNR at the receiver output). For example, the constant target EVM value may be calculated by subtracting 6 dB from the negative of the minimum required SNR that permits good reception, i.e.

$$EVM_{const} = (-SNR_{min} - 6 \text{ dB}).$$

Thus, where the minimum required SNR at the receiver is 30 dB, $EVM_{const} = (-30 \text{ dB} - 6 \text{ dB}) = -36 \text{ dB}$.

In this way, the error vector magnitude (represented on a logarithmic scale) for each symbol is equal to or less than the constant target EVM value $EVM_{const}$.

The constant target EVM value $EVM_{const}$ may be selected according to the data rate of the transmitted packet, as the minimum required SNR that permits good reception at a receiver is dependent on the data rate of the transmitted packet. For example, in order for satisfactory reception of a packet transmitted at 54 Mbps, the EVM of the symbols in the packet must be lower than for a data packet transmitted at 6 Mbps.

Where the back-off level is selected to achieve the best SNR for each symbol, to calculate the SNR of a symbol the following formula is used by the symbol processor 24:

$$SNR = 10\log_{10}(SNR\_lin),$$

$$\text{where } SNR\_lin = \frac{1}{EVM\_lin + 10^{\frac{(K-back\_off\_dB)}{10}}},$$

where back_off_dB is a candidate power amplifier back-off value in dB for which the SNR of the symbol is to be calculated and K is a constant in dB. EVM_lin is the EVM value calculated by the symbol processor 24 for the symbol, based on the candidate back-off value, as will be described below.

In one example the constant K may be calculated as $$K=-\text{sensitivity\_dB}-6\text{ dB}-\text{constant-back-off\_dB},$$

where sensitivity_dB is the sensitivity of the power amplifier 18 in dB, constant_back-off_dB is a constant back-off value used in the power amplifier 18 when the present adaptive back-off scheme is not used, and which may be, for example, 9 dB. The −6 dB modifier in the calculation of the constant K is based on the assumption that the power amplifier 18 is optimised for a noise level below its sensitivity, with SNR typically being 6 dB higher than the sensitivity of the power amplifier 18.

The symbol processor 24 must compute the EVM of each symbol to be transmitted for each of the candidate back-off levels. To do this, the symbol processor 24 first sorts the digital samples of the symbols to be transmitted that it receives from the digital pre-distorter 16 by decreasing order of amplitude.

Each of the candidate back-off levels is converted into a clipping level by the symbol processor 24, to simulate clipping of the symbols that may occur in the power amplifier 18 if the candidate back-off level were employed. This conversion of each of the candidate back-off levels to a clipping level relies on an assumption that the average signal level of a symbol is constant. Thus, the clipping level of a particular symbol for each candidate back-off level can be calculated by the symbol processor 24 using the equation Clipping_Level=Avg_Level×Back_Off, where Clipping_Level is the clipping level for the candidate back-off level, Avg_Level is the average signal level of a symbol, and Back_Off is the candidate back-off level for which the clipping level is to be calculated.

The amplitude of the samples of the symbol to be transmitted is compared by the symbol processor 24 to the clipping level, and clipping is applied to those samples that exceed the threshold, by reducing their amplitude to the clipping level. As the samples are sorted in decreasing order of amplitude, once a sample falls below the clipping level there is no need to compare any subsequent samples to the clipping level, which helps to increase the speed and reduce the computational demands of the process of applying clipping to the samples.

For those samples that have been clipped, the symbol processor 24 calculates the square of the difference between the actual amplitude of the sample and the clipping threshold, i.e.

Square_Difference=(Actual_Amplitude−Clipping_Level)$^2$, where Actual_Amplitude is the actual amplitude of the sample for a particular transmitted symbol.

The resulting values of the square of the difference between the actual amplitude of the sample and the clipping threshold are summed for all of the clipped samples and divided by the number of samples in a symbol to obtain a value for the square of the difference for the symbol. This value is then divided by the average signal level average Avg_Level to arrive at a value for the linear time domain EVM for the symbol for the candidate back-off value, referred to above as EVM_lin.

A correction is then applied by the symbol processor 24 to the linear time domain EVM value to obtain a value that takes into account only the modulated sub-carriers in the composite signal. The correction may be a predefined function or value obtained by simulation, with the predefined function or value being stored in the symbol processor 24 and applied to the samples to effect the correction. For example, the correction may be effected by applying a function of the form:

$$EVM\_Mod = 10^{\left(\frac{[10\log_{10}(EVM\_lin)/1.2+3]}{10}\right)}$$

This is equal to

EVM_Mod=2×EVM_lin$^{1.2}$

Once the EVM value EVM_Mod for each of the plurality of candidate back-off level values have been computed by the symbol processor 24 for a symbol, the symbol processor 24 computes the SNR of the symbol for each of the candidate back-off levels, and selects the candidate back-off level that meets the applicable criterion for selection. Thus, where the criterion for selection of a particular back-off is a constant EVM value EVM$_{const}$, the candidate back-off level that causes the EVM value EVM_Mod to meet the constant EVM value EVM$_{const}$ is selected and applied to the power amplifier 18, by adjusting a variable digital gain of the power amplifier 18, for the transmission of the relevant symbol. On the other hand, if the criterion for selection of a particular back-off level is maximum SNR in the transmitted symbols, the candidate back-off level that results in the highest SNR for the symbol is selected and applied to the power amplifier 18 for the transmission of the relevant symbol.

Subsequent symbols are processed in the same manner by the symbol processor 24 to identify and select the candidate back-off level that provides either the maximum SNR or the constant EVM value EVM$_{const}$ for each of the subsequent symbols. In this way, the back-off level of the power amplifier 18 is dynamically adjusted for each symbol to be transmitted to increase the power efficiency of the power amplifier 18 and ultimately the transmitter 10.

Applying the selected back-off value to the power amplifier 18 may be applied simply by adjusting a variable digital gain of the power amplifier 18. The selected back-off value is then implemented by multiplying each sample of the symbol to be transmitted by $$\frac{1}{Back\_Off}$$

(or equivalently by dividing each sample of the symbol to be transmitted by Back_Off), leaving the supply voltage to the power amplifier 16 unchanged. In this case, in order successfully to receive the transmitted symbols a receiver may be required to estimate the received power on a per symbol basis.

However, in some circumstances it may be advantageous to adjust a supply voltage of the power amplifier 18 to accommodate the selected back-off value. In this case, the supply voltage of the power amplifier 18 may be adjusted during a guard interval of each symbol, which is present at the beginning of each symbol, to ensure that the correct supply voltage is provided to the power amplifier 18 for each symbol to be transmitted. The settings of the digital pre-distorter 16 may also need to be adjusted to accommodate the selected back-off value. In this way, the transmitted power is constant and a standard receiver (i.e. a receiver that doe not need to estimate the received power on a per symbol basis) can demodulate the symbols.

It will be appreciated that the transmitter 10 approaches the problem of high PAPR in OFDM systems in a new way, by dynamically adjusting the back-off of the power amplifier 18 for each symbol to be transmitted. This approach can be used in isolation to improve the power efficiency of an OFDM transmitter, but it is envisaged that this approach will be used to complement existing methods for reducing PAPR and pre-distorting amplifier input signals to compensate for non-linearities in the amplifier.

The invention claimed is:

1. A transmitter for transmitting data symbols using an orthogonal frequency division multiplexing (OFDM) scheme, the transmitter comprising:
    a modulator for generating a plurality of mutually orthogonal sub-carriers, each of the plurality of sub-carriers being modulated with a stream of data symbols to be transmitted;
    an amplifier for amplifying a signal containing the plurality of modulated sub-carriers for transmission of the signal; and
    a symbol processor for processing the data symbols of the plurality of sub-carriers, the symbol processor being configured to compute a plurality of error vector magnitude (EVM) values for each data symbol to be transmitted, each of the plurality of EVM values being computed based on a different one of a plurality of candidate back-off values for the amplifier, and to select one of the plurality of candidate back-off values to apply to the transmitter for the data symbol based on the computed EVM values, wherein the symbol processor is configured to select one of the plurality of candidate back-off values for which the computed EVM value meets a constant target EVM value that must be achieved by all of the transmitted symbols, wherein the constant target EVM value is based on a minimum required signal to noise ratio (SNR) that must be achieved at a receiver to permit good reception of the transmitted symbol, and wherein the constant target EVM value is dependent upon the data rate of the transmitted symbol.

2. A transmitter according to claim 1 wherein the symbol processor is configured to compute the SNR at the receiver for each of the plurality of candidate back-off values using the EVM value computed for each of the plurality of candidate back-off values, and to select the candidate back-off value that produces the highest SNR.

3. A transmitter according to claim 1, wherein the selected candidate back-off value is applied by dividing each sample of the symbol to be transmitted by the selected candidate back-off value.

4. A transmitter according to claim 1, further comprising a peak to average power ratio (PAPR) reduction unit configured to receive a signal containing the plurality of modulated sub-carriers and to process the received signal to reduce its PAPR.

5. A transmitter according to claim 1 further comprising a pre-distorter configured to receive a signal containing the plurality of modulated sub-carriers and to apply distortion to the received signal to compensate for distortion that will be introduced to the received signal by the amplifier.

6. A transmitter for transmitting data symbols using an orthogonal frequency division multiplexing (OFDM) scheme, the transmitter comprising:
    a modulator for generating a plurality of mutually orthogonal sub-carriers, each of the plurality of sub-carriers being modulated with a stream of data symbols to be transmitted;
    an amplifier for amplifying a signal containing the plurality of modulated sub-carriers for transmission of the signal; and
    a symbol processor for processing the data symbols of the plurality of sub-carriers, the symbol processor being configured to compute a plurality of error vector magnitude (EVM) values for each data symbol to be transmitted, each of the plurality of EVM values being computed based on a different one of a plurality of candidate back-off values for the amplifier, and to select one of the plurality of candidate back-off values to apply to the transmitter for the data symbol based on the computed EVM values, wherein the selected candidate back-off value is applied by adjusting a supply voltage of the power amplifier only during a guard interval of the symbol to be transmitted.

7. A method for transmitting data symbols using an orthogonal frequency division multiplexing (OFDM) scheme, the method comprising:
    generating a plurality of mutually orthogonal sub-carriers, each of the plurality of sub-carriers being modulated with a stream of data symbols to be transmitted;
    using an amplifier to amplify a signal containing the plurality of modulated sub-carriers for transmission of the signal; and
    processing the data symbols of the plurality of sub-carriers, wherein processing the data symbols comprises computing a plurality of error vector magnitude (EVM) values for each data symbol to be transmitted, each of the plurality of EVM values being computed based on a different one of a plurality of candidate back-off values for the amplifier, and selecting one of the plurality of candidate back-off values to apply for the data symbol based on the computed EVM values, the method further comprising selecting one of the plurality of candidate back-off values for which the computed EVM value meets a constant target EVM value that must be achieved by all of the transmitted symbols, wherein the constant target EVM value is based on a minimum required signal to noise ratio (SNR) that must be achieved at a receiver to permit good reception of the transmitted symbol, and wherein the constant target EVM value is dependent upon the data rate of the transmitted symbol.

8. A method according to claim 7 wherein the processing the data symbols further comprises computing the SNR at the receiver for each of the plurality of candidate back-off values using the EVM value computed for each of the plurality of candidate back-off values, and selecting the candidate back-off value that produces the highest SNR.

9. A method according to claim 7, wherein the selected candidate back-off value is applied by dividing each sample of the symbol to be transmitted by the selected candidate back-of value.

10. A method according to claim 7, further comprising receive a signal containing the plurality of modulated sub-carriers and processing the received signal to reduce its PAPR.

11. A method according to claim 7 further comprising receiving a signal containing the plurality of modulated sub-carriers and applying distortion to the received signal to compensate for distortion that will be introduced to the received signal by the amplifier.

12. A method for transmitting data symbols using an orthogonal frequency division multiplexing (OFDM) scheme, the method comprising:
  generating a plurality of mutually orthogonal sub-carriers, each of the plurality of sub-carriers being modulated with a stream of data symbols to be transmitted;
  using an amplifier to amplify a signal containing the plurality of modulated sub-carriers for transmission of the signal; and
  processing the data symbols of the plurality of sub-carriers, wherein processing the data symbols comprises computing a plurality of error vector magnitude (EVM) values for each data symbol to be transmitted, each of the plurality of EVM values being computed based on a different one of a plurality of candidate back-off values for the amplifier, and selecting one of the plurality of candidate back-off values to apply for the data symbol based on the computed EVM values, wherein the selected candidate back-off value is applied by adjusting a supply voltage of the power amplifier only during a guard interval of the symbol to be transmitted.

* * * * *